US012207455B2

(12) United States Patent
Feng et al.

(10) Patent No.: US 12,207,455 B2
(45) Date of Patent: Jan. 21, 2025

(54) COMPOSITE COVER PLATE, METHOD FOR PREPARING THE SAME, AND DISPLAY DEVICE CONTAINING COMPOSITE COVER PLATE

(71) Applicant: Xiamen Tianma Display Technology Co., Ltd., Xiamen (CN)

(72) Inventors: Jingxiao Feng, Xiamen (CN); Zhiqiang Xia, Xiamen (CN); Yan Lin, Xiamen (CN); Lilian Kuang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 132 days.

(21) Appl. No.: 17/950,553

(22) Filed: Sep. 22, 2022

(65) Prior Publication Data
US 2023/0247813 A1 Aug. 3, 2023

(30) Foreign Application Priority Data
Jun. 28, 2022 (CN) .......................... 202210750536.X

(51) Int. Cl.
| | | |
|---|---|---|
| *H05K 9/00* | (2006.01) | |
| *B05D 1/02* | (2006.01) | |
| *C09D 7/61* | (2018.01) | |
| *C09D 7/63* | (2018.01) | |
| *C09D 171/08* | (2006.01) | |

(Continued)

(52) U.S. Cl.
CPC ............ *H05K 9/0067* (2013.01); *B05D 1/02* (2013.01); *C09D 7/61* (2018.01); *C09D 7/63* (2018.01); *C09D 171/08* (2013.01); *H05K 5/0018* (2022.08); *H05K 5/03* (2013.01); *B05D 2500/00* (2013.01); *B05D 2518/00* (2013.01)

(58) Field of Classification Search
None
See application file for complete search history.

(56) References Cited

U.S. PATENT DOCUMENTS

2009/0155581 A1\* 6/2009 Lee ...................... C09D 5/1675
524/462

FOREIGN PATENT DOCUMENTS

| CN | 105693949 A | 6/2016 |
| CN | 111334187 A | 6/2020 |
| CN | 112909069 A | 6/2021 |

(Continued)

*Primary Examiner* — Michael P. Rodriguez
(74) *Attorney, Agent, or Firm* — KDW Firm PLLC

(57) ABSTRACT

Provided is a composite cover plate including a substrate body, wherein the substrate body includes two surfaces that are arranged opposite, at least one surface is provided with an antistatic film layer; the antistatic film layer includes a perfluoropolyether mixture and a silane coupling agent. Further provided is a method for preparing a composite cover plate, including: providing a substrate body with two surfaces that are arranged opposite, and spraying an antistatic film layer on at least one surface of the substrate body; wherein the antistatic film layer includes a perfluoropolyether mixture and a silane coupling agent. Further provided is a display device including a display module and a composite cover plate covering the surface of the display module, wherein the composite cover plate is any composite cover plate provided herein, an antistatic film layer is arranged on a side of the composite cover plate away from the display module.

10 Claims, 5 Drawing Sheets

(51) Int. Cl.
*H05K 5/00* (2006.01)
*H05K 5/03* (2006.01)

(56) References Cited

FOREIGN PATENT DOCUMENTS

| | | | | |
|---|---|---|---|---|
| CN | 113690276 A | * | 11/2021 | ......... H01L 27/0248 |
| CN | 113903260 A | | 1/2022 | |

* cited by examiner

COMPOSITE COVER PLATE, METHOD FOR PREPARING THE SAME, AND DISPLAY DEVICE CONTAINING COMPOSITE COVER PLATE

CROSS-REFERENCE TO RELATED APPLICATION(S)

This application claims priority to Chinese Patent Application No. 202210750536.X filed Jun. 28, 2022, the disclosure of which is incorporated herein by reference in its entirety.

TECHNICAL FIELD

The present application relates to the field of display and, in particular, to a composite cover plate, a method for preparing the same, and a display device containing the composite cover plate.

BACKGROUND

In the process of manufacturing and test of display devices, static electricity is easy to be generated due to friction. In addition, static electricity in the air, human body or other charged objects is also transferred to display devices. Mobile phones, PADs and other display devices used in daily life all have a touch function. When these display devices are used, the touching subject (such as a finger) frequently touches the display screen or slides on the display screen, and at this point, when there is static electricity on the display screen, static electricity is very likely to affect the normal display of products. When static electricity cannot be released or is not fully released, the accumulated static electricity will affect the display effect of the display panel. For example, when static electricity accumulates on the display screen, the location where static electricity accumulates on the screen is very likely to locally emit light and the accumulated static electricity even damages the display device.

SUMMARY

The present application provide a composite cover plate, a method for preparing the same, and a display device containing the composite cover plate.

In a first aspect, the present application provides a composite cover plate. The composite cover plate includes a substrate body, the substrate body includes two surfaces that are arranged opposite, at least one surface is provided with an antistatic film layer, and the antistatic film layer includes a perfluoropolyether mixture and a silane coupling agent.

In a second aspect, the present application provides a preparation method of a composite cover plate. The method includes the following steps: providing a substrate body with two surfaces that are arranged opposite, and spraying an antistatic film layer on at least one surface of the substrate body, wherein the antistatic film layer includes a perfluoropolyether mixture and a silane coupling agent.

In a third aspect, the present application provides a display device, which includes a display module and a composite cover plate covering the surface of the display module. The composite cover plate includes a substrate body, the substrate body includes two surfaces that are arranged opposite, at least one surface is provided with an antistatic film layer, and the antistatic film layer includes a perfluoropolyether mixture and a silane coupling agent; and the antistatic film layer is arranged on a side of the composite cover plate away from the display module.

DETAILED DESCRIPTION

Figure 1:
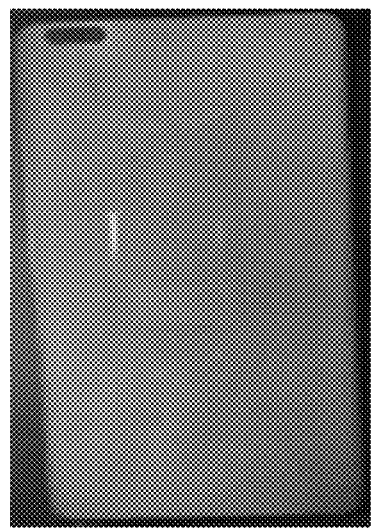
FIG. 1 is a photo diagram showing the edge luminescence phenomenon in the related art.

The detailed description of the composite cover plate, the method for preparing the same, and the display device containing the composite cover plate provided by the embodiments of the present application will be described in detail with reference to the drawings. It is to be noted that the embodiments described herein are part, not all, of embodiments of the present application. Based on the embodiments of the present application, all other embodiments obtained by those of ordinary skill in the art without creative work are within the scope of the present application.

In the drawings, the thickness of areas and layers may be exaggerated for clarity. The same reference numerals in the drawings denote the same or similar structures, and thus the description of the same reference numerals will not be repeated.

The characteristics, structures or features described herein may be combined in one or more embodiments in any suitable manner. In the following description, numerous specific details are set forth to give a full understanding of the embodiments of the present disclosure. However, those skilled in the art will appreciate that the technical solutions of the present disclosure may be practiced without one or more of the specific details or practiced by other methods, components, materials, etc. In some cases, well-known structures, materials or operations are not shown or described in detail to avoid obscuring the major creative technology of the present disclosure.

When a certain structure is "on" other structures, it may mean that the structure is integrally formed on other structures or that the structure is "directly" arranged on other structures or that the structure is "indirectly" arranged on other structures through another structure.

The terms "a", "one", and "the" are used to indicate the presence of one or more elements, components, etc. The terms "include" and "have" are used to indicate open inclusion and indicate that there may be additional elements, components, etc. in addition to the listed elements, components, etc. The terms "first", "second" and the like may be used herein to describe various areas, layers and/or portions, but these areas, layers and/or portions are not limited by these terms. These terms are used to distinguish one area, layer and/or portion from another.

Figure 2:
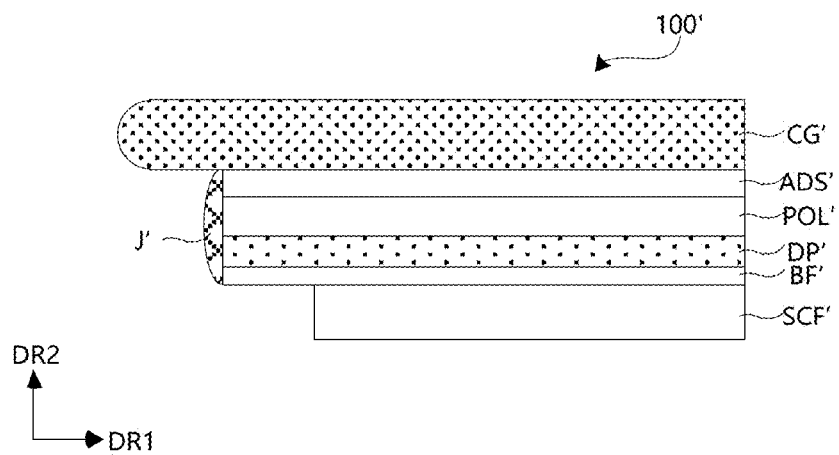
FIG. 2 is a schematic diagram of a display device in the related art.
Figure 3:
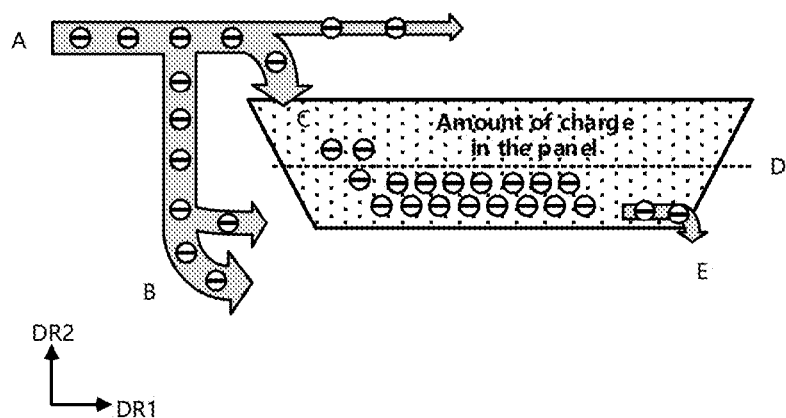
FIG. 3 is a principal diagram of adverse cause analysis in the related art.

In organic light emitting diode (OLED) products, there is a copper rod rub test for the reliability verification of a display panel, and the object of the test is to verify the stability of the mobile phone screen after long-term screen swiping. The copper rod is used in the test. On the basis that the display device such as a mobile phone emits light, the copper rod slides on the screen at a certain speed. The judgment standard is that abnormal display phenomena such as local luminescence and blurred screen are not allowed to appear in middle and low grayscales. In the process of rubbing the display screen with the copper rod, the copper rod is a conductor and negatively charged, and the display screen is positively charged. It is found through the test that when static electricity accumulates in some locations of the screen, the display screen may locally emit light, as shown in FIG. 1 which is a photo diagram showing the edge luminescence phenomenon in the related art, and the figure shows the visual effect of 2 nits L32 after the display screen is rubbed with the copper rod for 8 hours. According to the test and adverse analysis, it is speculated that static electricity is produced in the rubbing process, then moves to the edge of the composite cover plate glass and further moves to the edge of the display substrate. As shown in FIGS. 2-3, FIG. 2 is a schematic diagram of a display device in the related art, and FIG. 3 is a principal diagram of adverse cause analysis in the related art. A display module 100' includes a display panel DP' and a bottom protective film BF'. In order to enhance heat dissipation, a metal heat dissipation layer SCF' may also be arranged (for example, in a manner of sticking or bonding) on the back side of the display panel DP'. The display panel DP' includes a substrate, a driving functional layer and a display functional layer (not shown) which are stacked sequentially and also includes a polarizing layer POL', an adhesive layer ADS' and a composite cover plate CG' which are sequentially stacked on the display functional layer. When the optionally clear adhesive (OCA) overflows to form an adhesive overflow portion J', the adhesive overflow portion J' forms a shorter charge transfer path (as path B in FIG. 3). As a result, the charge accelerates to accumulate at the edge of the display substrate and forms a large electrostatic field, which affects the characteristics of the accessory thin-film transistor (TFT) (with reference to FIG. 10), resulting in the positive shift of the threshold voltage Vth of the thin-film transistor and the increase of the subthreshold swing. In low grayscales, due to the small current, it will take a longer time to charge the OLED, and the charging time has a great influence on luminescence. When the subthreshold swing is too large, the current will increase, and the OLED will be charged faster and will become significantly brighter. Since RGB has different sensitivities to charging and G is more sensitive to the charging time of the OLED, when the subthreshold swing increases, the edge portion turns green in low grayscales.

In order to solve the problem that the edge of the screen emits light or turns green due to static electricity accumulated on the surface of the composite cover plate, in one embodiment of the related art, a conductive liquid is coated at the edge of the film material on the back side of the composite cover plate of the display module to conduct the surface of the composite cover plate with the copper foil behind the composite cover plate, so as to enhance the ability to conduct static electricity away from the surface of the product. However, in this manner, the electrostatic liquid leads to uneven thickness of the back side of the product, which leads to an increase in the assembly risk of the whole machine. In another embodiment of the related art, a low-resistance heat dissipation layer (SCF) is adopted to improve the ability to conduct static electricity away from the product. However, in this embodiment, the lightness of the new foam tape and the risk are unknown, and the external ESD is easy to introduce, which may affect the display effect of the screen. In another embodiment of the related art, the optical adhesive layer (OCA) is retracted to conduct the surface of the composite cover plate with the copper foil behind the composite cover plate, so as to enhance the ability to conduct static electricity away from the surface of the product. However, in this manner, the retraction of the OCA will increase the risk of cracks and bubbles in the bonding position.

In view of the above, the present application provides a composite cover plate and a display device containing the composite cover plate. The display device containing the composite cover plate has the following advantages.

Advantage 1: compared with other solutions for improving the copper rod rub effect, the technical solution of the present application does not involve the change of the product structure and is convenient to implement.

Advantage 2: with the solution of improving the surface film layer of the composite cover plate, the solution can be introduced and used at any site of the production process, and the treatment effect is not affected by other factors.

Advantage 3: the silane coupling agent has low cost, is a common material, and thus does not need to be limited by high process cost.

Advantage 4: the silane coupling agent is easy to degrade and is pollution-free compared with other additives.

Figure 4:
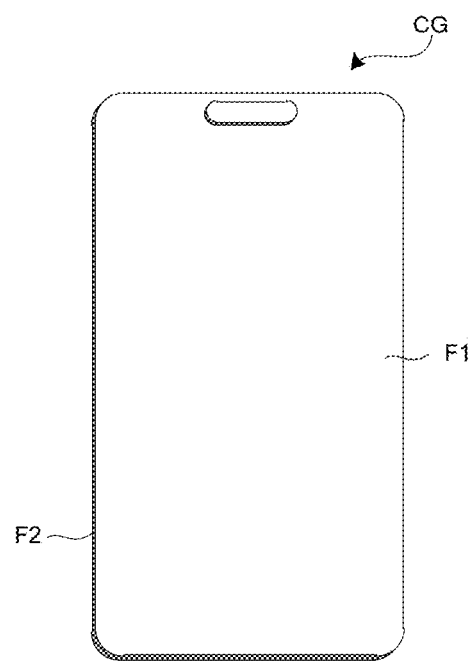
FIG. 4 is a structural diagram of a composite cover plate according to the present application.
Figure 5:
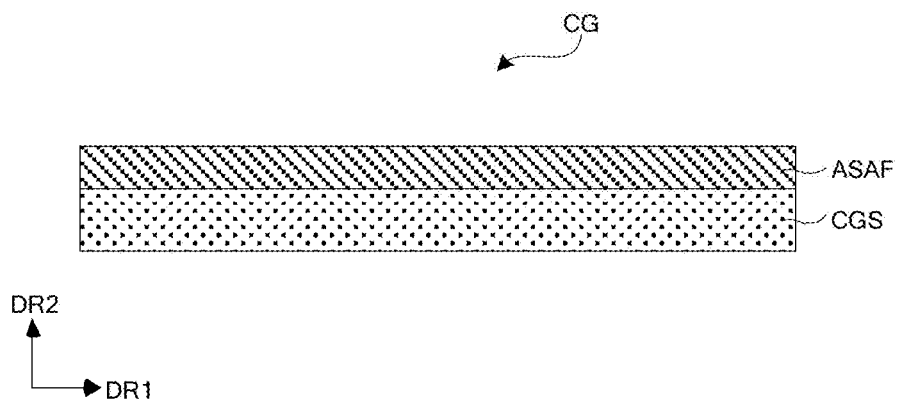
FIG. 5 is a cross-sectional structural diagram of a composite cover plate according to the present application.

In some embodiments, the present application provides a composite cover plate, as shown in FIGS. 4-5. FIG. 4 is a structural diagram of a composite cover plate according to the present application, and FIG. 5 is a cross-sectional structural diagram of a composite cover plate according to the present application. A composite cover plate CG includes a composite cover plate body CGS. The composite cover plate body CGS includes two surfaces F1 and F2 that are arranged opposite, for example, F1 may be a surface of the side of the composite cover plate CG away from the display panel, and at least one surface is provided with an antistatic film layer ASAF. In one embodiment, the antistatic film layer may be provided on the side of the screen facing towards the user, that is, the surface of the side of the composite cover plate CG away from the display panel, for example, F1, so that the damage of static electricity to the display panel can be reduced when the finger of the user slides repeatedly on the screen. However, both sides of the composite cover plate CG may be provided with the antistatic film layer according to actual requirements to further reduce the impact on the display panel, which is not specifically limited to the present application.

In some embodiments, the composite cover plate serves to protect the display module, and the substrate of the composite cover plate may be glass, such as ceramic shield glass, ultra-thin flat glass, ceramics, sapphire, etc., and may be covered in 2D, 2.5 D or 3D. In some embodiments, the substrate of the composite cover plate may define the front surface of the housing. In some embodiments, the substrate of the composite cover plate may define the front surface of the housing and all or part of the side surfaces of the housing.

An anti-reflection (AR) coating, an anti-glare (AG) coating, a coating for improving the hardness of the polarizer or the like may be provided on the side of the antistatic film layer ASAF away from the composite cover plate body CGS to improve the performance of the polarizer (not shown in the figure).

The antistatic film layer ASAF includes a perfluoropolyether mixture and a silane coupling agent. The perfluoropolyether mixture is the main component of the coating that is easy to clean and may include materials selected from the following groups: fluorine-containing alkylsilanes, perfluoropolyetheralkoxysilanes, perfluoroalkylalkoxysilanes, fluorine-containing alkylsilane-(fluorine-free alkylsilane) copolymers, and a mixture of fluorine-containing alkylsilane. In some embodiments, one or more materials of selected types of silanes containing perfluorinated groups may be included, such as perfluoroalkyl silane of the chemical formula $(RF)_y SiX_{4-y}$, wherein RF is straight chain C6-C30 perfluoroalkyl; X is Cl, acetoxy, —$OCH_3$ and —$OCH_2CH_3$; and y is 2 or 3. The perfluoroalkyl silane may be purchased from numerous market suppliers, including DOW CORNING (for example, Fluorocarbon 2604 and 2634), 3M COMPANY (for example, ECC-1000 and ECC-4000) and other fluorocarbon suppliers such as DAIKIN CORPORATION, CEKO (South Korea), COTEC GmbH (DURALON UltraTec materials) and EVONIK. One terminal of the oxygen-containing alkyl group (SiOR) in the active agent molecule of the silane coupling agent is a lipophilic group and the other terminal is an oil-repellent group. The lipophilic group binds to perfluorohexadecane that is the main component of the perfluoropolyether mixture to form a long-chain fluorine-containing silane coupling agent structure, and the oil-repellent group at the other terminal ensures the overall anti-fingerprint pollution characteristics.

In some embodiments, the silane coupling agent may include a sulfur-containing silane coupling agent, an amino silane coupling agent and an epoxy silane coupling agent. The molecular structural formula of the silane coupling agent is Y—R—Si(OR)$_3$, such as one or more of polyether trisiloxane, hydroxyl polyether modified polyorganosiloxane, carboxyl polyethylene glycol silane, polyether modified polydimethylsiloxane, polyether modified polysiloxane, tetramethyldisiloxane, dodecylsiloxane, dimethyldichlorosilane, and organic monosiloxane. In the formula, "Y" refers to an organic functional group such as hydrocarbon functional groups (alkyl RH, alkenyl $R_2C=CR_2$, alkynyl RC≡CR, etc.), halogen-containing substituents (carbon-halogen bond RX, carbon-fluorine bond R, carbon-chlorine bond RCl, etc.), and oxygen-containing functional groups (haloformyl RCOX, hydroxyl ROH, carbonyl RCOR', aldehyde RCHO, carbonate ROCOOR, carboxylate RCOO, carboxyl RCOOH, ether ROR', ester RCOOR', etc.). The group "—R—" in the structural formula of the silane coupling agent in the present patent mainly refers to a sulfur-containing carboxyl group, a sulfur-containing hydroxyl group, an amino-containing carboxyl group, an amino-containing hydroxyl group, an epoxy carboxyl group and an epoxy hydroxyl group. SiOR refers to a siloxy group. The sulfur-containing bonds strongly bind to the molecule, which can make the antistatic film layer more complete. The amino groups can improve the dissolution efficiency and molecular activity of additives. The epoxy silane coupling agent has relatively strong reactivity, which makes the epoxy group bond with the perfluoropolyether mixture, so as to enhance the stability of the solution.

In some embodiments, the silane coupling agent may specifically include one or more of polyether monosiloxane, polyether trisiloxane, polyether polysiloxane, hydroxyl polyether modified polyorganosiloxane, carboxyl polyethylene glycol silane, polyether modified polydimethylsiloxane, polyether modified polysiloxane, tetramethyldisiloxane, dodecylsiloxane, dimethyldichlorosilane and organic monosiloxane.

In some embodiments, a mass ratio of the perfluoropolyether mixture to the silane coupling agent ranges from 100:1 to 90:1 and further may range from 100:1 to 95:1, so as to achieve the balanced characteristics of fingerprint pollution resistance and static electricity resistance. If the amount of the silane coupling agent is high, there is a risk of destroying the bonding to the molecular structure in the perfluoropolyether mixture. If the amount of the silane coupling agent is low, the conductive film layer cannot be formed effectively, which further affects the effect of release and dissipation of static electricity.

In some embodiments, the perfluoropolyether mixture and the silane coupling agent are uniformly distributed in the antistatic film layer ASAF. One terminal of the oxygen-containing alkyl group (SiOR) in the active agent molecule of the silane coupling agent is a lipophilic group and the other terminal is an oil-repellent group. The lipophilic group binds to perfluorohexadecane that is the main component of the perfluoropolyether mixture to form a long-chain fluorine-containing silane coupling agent structure, and the oil-repellent group at the other terminal ensures the overall anti-fingerprint pollution characteristics.

In some embodiments, the surface resistivity of the antistatic film layer ASAF is between $10^{13}$ Ω·cm and $10^{16}$ Ω·cm and further may be between $10^{13}$ Ω·cm and $10^{14}$ Ω·cm. The antistatic film layer ASAF has lower surface resistivity than the conventional glass surface, and the charge transfer rate in this film layer is higher, which can reduce the damage of static electricity to the display panel.

Figure 6:
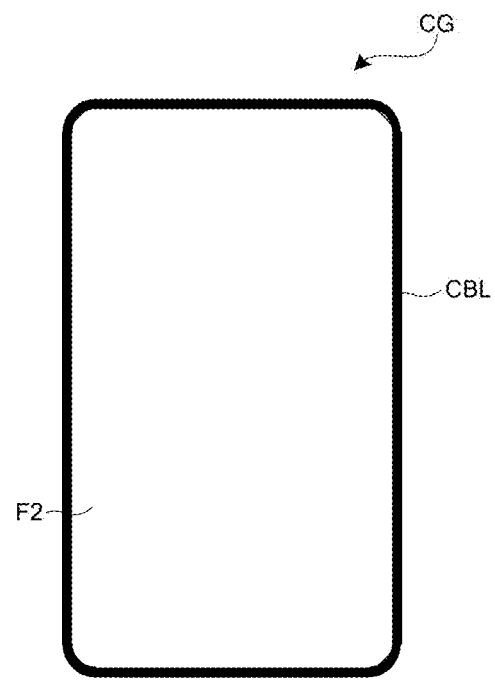
FIG. 6 is a top view of the side of a composite cover plate away from the light emission surface according to the present application.
Figure 7:
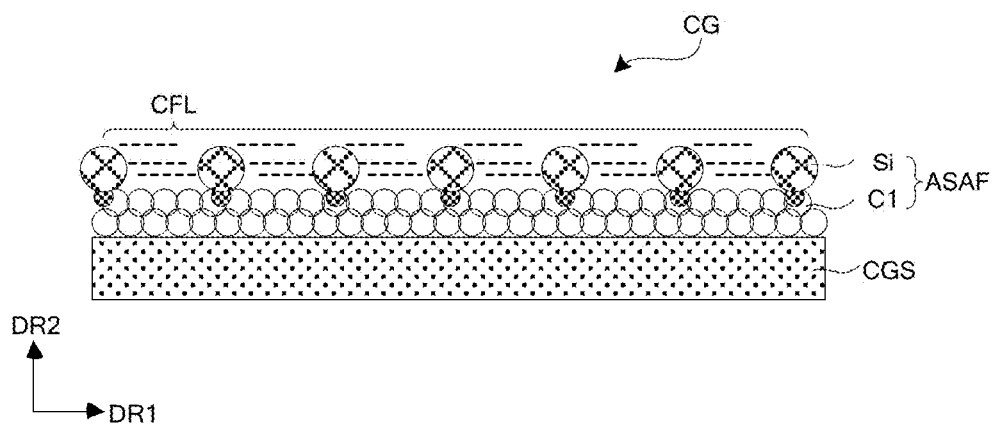
FIG. 7 is a microscopic schematic diagram of an antistatic film layer in a composite cover plate according to the present application.
Figure 8:
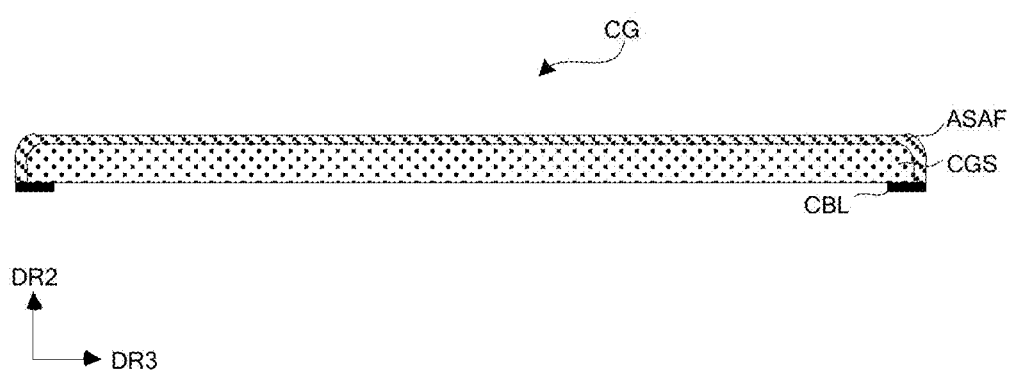
FIG. 8 is another cross-sectional structural diagram of a composite cover plate according to the present application.

Further, as shown in FIGS. 6-8, FIG. 6 is a top view of the side of a composite cover plate away from the light emission surface according to the present application; FIG. 7 is a microscopic schematic diagram of an antistatic film layer in a composite cover plate according to the present application; and FIG. 8 is another cross-sectional structural diagram of a composite cover plate according to the present application. The composite cover plate CG further includes a conductive blocking layer CBL, and the conductive blocking layer CBL is disposed around the edges of the composite cover plate CG, that is, the vertical projection of the conductive blocking layer CBL on the display panel is within the vertical projection of the composite cover plate on the display panel and the edge of the conductive blocking layer CBL coincides with the outer edge of the composite cover plate CG. The lipophilic group of the silane coupling agent binds to perfluorhexadecane that is the main component of the perfluoropolyether mixture to form a long-chain fluorine-containing silane coupling agent structure C1. Meanwhile, the macromolecular characteristics of the silane coupling agent form nano-scale silicon (Si)-containing protrusions on the glass surface, so as to form a conductive thin film CFL in contact with the conductive blocking layer, that is, since the edge of the composite cover plate is an arc structure, the antistatic film layer is in contact with the conductive blocking layer. The substrate body is surrounded by conductive copper foil, and the resistance is extremely low. Static electricity migrates to the low resistance direction through the conductive film layer in the antistatic film layer ASAF, and then the charge generated on the composite cover plate CG is conducted to the conductive blocking layer CBL through the conductive thin film, so as to achieve the release of static electricity.

In some embodiments, the conductive blocking layer CBL may be ink.

In some embodiments, with continued reference to FIG. 5, a thickness of the antistatic film layer ASAF is between 5 nm and 20 nm and further may be between 5 nm and 10 nm. The preceding setting can ensure the effective binding of the perfluoropolyether mixture and the surface of the product, and meanwhile, the macromolecular particles can form protrusions on the relatively smooth surface of the perfluoropolyether mixture, so as to form a conductive film layer.

In some embodiments, the antistatic film layer ASAF may also include an emulsifier. The emulsifier may be calcium stearate or silicate and can improve the molecular particle binding efficiency between the silane coupling agent and the perfluoropolyether mixture. Meanwhile, the emulsifier can make the antistatic film layer ASAF have good hydrophobic characteristics, and a water contact angle is tested to be between 100° and 115°. The emulsifier can also make the antistatic film layer ASAF have outstanding wear resistance, scratch resistance and surface hardness, and after rubbing with 1 $cm^2$ steel wool for 1000 times under 1000 $g/cm^2$ pressure, there is no trace and no loss of light on the surface, and the water contact angle is tested to be between 80° and 110°.

In addition, the present application also provides a method for preparing a composite cover plate, and the antistatic performance of the composite cover plate can be verified in the following manner.

The verification manner is a copper rod rub test. The present application does not specifically limit the test method, and the following is only an exemplary illustration. The test method is carried out using an electrostatic tester capacitor pen point (with a diameter of 7 mm). The capacitor pen point continuously rubs the screen at a pressure of 100 g and at a speed of 100 mm/s by drawing hollow squares along the inner side of the screen at 15 mm to perform the copper rod rub test. The amount of static electricity on the surface of the product is recorded before the rubbing. Whether there are abnormal displays such as local green luminescence, blurred screen and splash screen is checked under W3 (White 3 grayscale) at the brightness of 500 nits and W32 (White 32 grayscale) at the brightness of 2 nits after the rubbing is performed for 8 hours and 24 hours, respectively. The Level is measured according to the limit samples specified by the factory according to the specifications issued by the customer, and the difference between the initial static electricity amount on the surface of the product and the static electricity amount after 8 hours is read.

Specifically, the preparation method includes the following steps.

The composite cover plate CG includes a substrate body CGS, wherein the substrate body CGS includes two surfaces F1 and F2 that are arranged opposite; and an antistatic film layer ASAF is sprayed on at least one surface of the substrate body, wherein the antistatic film layer ASAF includes a perfluoropolyether mixture and a silane coupling agent.

In some embodiments, the specific operation of "an antistatic film layer ASAF is sprayed on at least one surface of the substrate body" is as follows:

a stock solution formed by the perfluoropolyether mixture and the silane coupling agent is uniformly coated on the surface of one side of the substrate body CGS using a high-pressure nozzle, and baked at a low temperature of 65° C. for 2 hours, and it is confirmed that a water contact angle of the surface of the composite cover plate CG is greater than or equal to 110°.

In some embodiments, the preparation of the stock solution formed by the perfluoropolyether mixture and the silane coupling agent includes the following steps:

the perfluoropolyether mixture and the silane coupling agent are placed in a high stirring cup, added an emulsifier with a mass percent of 0 to 1%, stirred for 5 minutes at a rate of 4000 r/min to 5000 r/min until the mixture is uniform, and stirred at a rate of 1000 r/min to 1500 r/min until bubbles disappear.

In some embodiments, the emulsifier includes calcium stearate or silicate.

In some embodiments, a mass ratio of the perfluoropolyether mixture to the silane coupling agent ranges from 100:1 to 90:1.

In some embodiments, the substrate body may be pretreated, including ultra-hydrophobic cleaning, plasma cleaning and the like, before the antistatic film layer ASAF is prepared. Specifically, the preparation method further includes: the original AF anti-fingerprint oil of a finished composite cover plate is removed, and the specific operation is as follows:

the finished composite cover plate is placed on a glass plate with a first surface upward, deplating by using Plasma (rotating nozzle, CDA, 1 kw, 10 min) is performed, and ionization deplating is performed on the original AF anti-fingerprint oil on the surface of the finished composite cover plate so that a water contact angle of the surface of the finished composite cover plate is less than or equal to 30°.

In the method for preparing the composite cover plate provided by the present application, the anti-fingerprint, anti-pollution and anti-static effects of the composite cover plate and the module applying the composite cover plate or the corresponding entire machine can be achieved by improving the surface film layer of the composite cover plate of the product using low-temperature spraying. The method can be introduced and used at any site of the production process, the process is simple, low-cost and environmentally friendly, the treatment effect is not affected by other factors, and the large-scale mass production can be implemented.

In the composite cover plate, the method for preparing the same, and the display device containing the composite cover plate provided by the present application, the antistatic film layer is an anti-fingerprint (AF) solution mixed with a silane coupling agent. Main components of the AF solution are perfluorohexadecane and butyl ether, both of which belong to chemical organic matters. Since a siloxy group of the silane coupling agent belongs to a lipophilic group while the other terminal is an oil-repellent group, the lipophilic group binds to perfluorohexadecane, the main component of the AF solution, so as to form a long-chain fluorine-containing silane coupling agent structure, the oil-repellent group at the other terminal ensures the overall anti-fingerprint pollution characteristics of the AF liquid so as to expose organic functional groups, and the friction between the selected organic functional groups and metal can hardly generate static electricity, thereby reducing the static electricity generated by the rub of copper rods and preventing the screen from turning green due to the static electricity accumulated on the surface of the composite cover plate.

The present application will be further described below through a plurality of examples, the parameters in the examples are illustrative and are not intended to further limit the present application, and the finally prepared antistatic film layer is within the scope of the present application.

Example 1

In S01, 200 g of perfluoropolyether mixture (ALC-500C) and 2 g of polyether trisiloxane (FC-2230) were placed in a high stirring cup, an emulsifier whose mass percent is 0 to 1% was added, the mixture was stirred for 5 minutes at a rate of 4000 r/min to 5000 r/min until the mixture was uniform, and finally, the mixture was stirred at a rate of 1000 r/min to 1500 r/min until bubbles disappeared.

In S02, the finished composite cover plate was placed on a glass plate with a first surface upward, deplating by using Plasma (rotating nozzle, CDA, 1 kw, 10 min) was performed, and ionization deplating was performed on the original AF anti-fingerprint oil on the surface of the finished composite cover plate so that a water contact angle of the surface of the finished composite cover plate was less than or equal to 30°.

In S03, a stock solution formed by the perfluoropolyether mixture and the silane coupling agent was uniformly coated on the surface of one side of the substrate body CGS using a high-pressure nozzle, baked at a low temperature of 65° C. for 2 hours, and it was confirmed that a water contact angle of the surface of the composite cover plate CG was greater than or equal to 110°.

In S04, the copper rod rub test was performed. The amount of static electricity on the surface of the product was recorded before the rubbing, whether there were abnormal displays such as local green luminescence, blurred screen and splash screen was checked under W3 (White 3 grayscale) at the brightness of 500 nits and W32 (White 32 grayscale) at the brightness of 2 nits after the rubbing was performed for 8 hours and 24 hours, respectively, the Level was measured according to the limit samples specified by the factory according to the specifications issued by the customer, and the difference between the initial static electricity amount on the surface of the product and the static electricity amount after 8 hours was read.

TABLE 1

Comparison of static electricity on the surface of the composite cover plate in Example 1

| Group | | Comparative group | | Example 1 | |
|---|---|---|---|---|---|
| Judgement picture | | 500 nits W3 | 2 nits W32 | 500 nits W3 | 2 nits W32 |
| Rub for 8 hours | Level | Level 1 | Level 0 | Level 0 | Level 0 |
| Rub for 24 hours | Level | Level 2 | Level 2 | Level 1 | Level 1 |
| Δ Static electricity amount (8 hours) | | −302 mv | | −64 mv | |

As can be seen from Example 1, the composite cover plate was significantly improved in the low grayscale brightness in the copper rod rub test, and the amount of accumulated static electricity after the copper rod rub was reduced. After the composite cover plate of Example 1 was added, the performance of the product was stable and can satisfy the production specifications of the customer. The static electricity basically all dissipated, and the static electricity dissipation speed of polyether trisiloxane was relatively fast.

Example 2

In S01, 200 g of perfluoropolyether mixture (ALC-500C) and 2 g of hydroxyl polyether modified polyorganosiloxane (FC-8033) were placed in a high stirring cup, an emulsifier whose mass percent is 0 to 1% was added, the mixture was stirred for 5 minutes at a rate of 4000 r/min to 5000 r/min until the mixture was uniform, and finally, the mixture was stirred at a rate of 1000 r/min to 1500 r/min until bubbles disappeared.

In S02, the finished composite cover plate was placed on a glass plate with a first surface upward, deplating by using Plasma (rotating nozzle, CDA, 1 kw, 10 min) was performed, and ionization deplating was performed on the original AF anti-fingerprint oil on the surface of the finished composite cover plate so that a water contact angle of the surface of the finished composite cover plate was less than or equal to 30°.

In S03, a stock solution formed by the perfluoropolyether mixture and the silane coupling agent was uniformly coated on the surface of one side of the substrate body CGS using a high-pressure nozzle, baked at a low temperature of 65° C. for 2 hours, and it was confirmed that a water contact angle of the surface of the composite cover plate CG was greater than or equal to 110°.

In S04, the copper rod rub test was performed. The amount of static electricity on the surface of the product was recorded before the rubbing, whether there were abnormal displays such as local green luminescence, blurred screen and splash screen was checked under W3 (White 3 grayscale) at the brightness of 500 nits and W32 (White 32 grayscale) at the brightness of 2 nits after the rubbing was performed for 8 hours and 24 hours, respectively, the Level was measured according to the limit samples specified by the factory according to the specifications issued by the customer, and the difference between the initial static electricity amount on the surface of the product and the static electricity amount after 8 hours was read.

TABLE 2

Comparison of static electricity on the surface of the composite cover plate in Example 2

| Group | | Comparative group | | Example 2 | |
|---|---|---|---|---|---|
| Judgement picture | | 500 nits W3 | 2 nits W32 | 500 nits W3 | 2 nits W32 |
| Rub for 8 hours | Level | Level 1 | Level 0 | Level 0 | Level 0 |
| Rub for 24 hours | Level | Level 2 | Level 2 | Level 0 | Level 0 |
| Δ Static electricity amount (8 hours) | | −302 mv | | −112 mv | |

As can be seen from Example 2, the composite cover plate was significantly improved in the low grayscale brightness in the copper rod rub test, and the amount of accumulated static electricity after the copper rod rub was reduced. After the composite cover plate of Example 2 was added, the performance of the product was stable and can satisfy the production specifications of the customer. However, the amount of residual static electricity was relatively large, because the static electricity dissipation speed of hydroxyl polyether modified polyorganosiloxane was relatively slow.

Example 3

In S01, 200 g of perfluoropolyether mixture (ALC-500C) and 2 g of polyether modified polydimethylsiloxane (FC-2235) were placed in a high stirring cup, an emulsifier whose mass percent is 0 to 1% was added, the mixture was stirred for 5 minutes at a rate of 4000 r/min to 5000 r/min until the mixture was uniform, and finally, the mixture was stirred at a rate of 1000 r/min to 1500 r/min until bubbles disappeared.

In S02, the finished composite cover plate was placed on a glass plate with a first surface upward, deplating by using Plasma (rotating nozzle, CDA, 1 kw, 10 min) was performed, and ionization deplating was performed on the original AF anti-fingerprint oil on the surface of the finished composite cover plate so that a water contact angle of the surface of the finished composite cover plate was less than or equal to 30°.

In S03, a stock solution formed by the perfluoropolyether mixture and the silane coupling agent was uniformly coated on the surface of one side of the substrate body CGS using a high-pressure nozzle, baked at a low temperature of 65° C. for 2 hours, and it was confirmed that a water contact angle of the surface of the composite cover plate CG was greater than or equal to 110°.

In S04, the copper rod rub test was performed. The amount of static electricity on the surface of the product was recorded before the rubbing, whether there were abnormal displays such as local green luminescence, blurred screen and splash screen was checked under W3 (White 3 grayscale) at the brightness of 500 nits and W32 (White 32 grayscale) at the brightness of 2 nits after the rubbing was performed for 8 hours and 24 hours, respectively, the Level was measured according to the limit samples specified by the factory according to the specifications issued by the customer, and the difference between the initial static electricity amount on the surface of the product and the static electricity amount after 8 hours was read.

TABLE 3

Comparison of static electricity on the surface of the composite cover plate in Example 3

| Group | Comparative group | | Example 3 | |
|---|---|---|---|---|
| Judgement picture | 500 nits W3 | 2 nits W32 | 500 nits W3 | 2 nits W32 |
| Rub for 8 hours | Level Level 1 | Level 0 | Level 0 | Level 0 |
| Rub for 24 hours | Level Level 2 | Level 2 | Level 0 | Level 0 |
| Δ Static electricity amount (8 hours) | −302 mv | | −154 mv | |

As can be seen from Example 3, the composite cover plate was significantly improved in the low grayscale brightness in the copper rod rub test, and the amount of accumulated static electricity after the copper rod rub was reduced. After the composite cover plate of Example 3 was added, the performance of the product was stable and can satisfy the production specifications of the customer. However, the amount of residual static electricity was relatively large, because the static electricity dissipation speed of polydimethylsiloxane was relatively slow.

Example 4

In S01, 200 g of perfluoropolyether mixture (ALC-500C) and 2 g of organic monosiloxane (FC-208) were placed in a high stirring cup, an emulsifier whose mass percent is 0 to 1% was added, the mixture was stirred for 5 minutes at a rate of 4000 r/min to 5000 r/min until the mixture was uniform, and finally, the mixture was stirred at a rate of 1000 r/min to 1500 r/min until bubbles disappeared.

In S02, the finished composite cover plate was placed on a glass plate with a first surface upward, deplating by using Plasma (rotating nozzle, CDA, 1 kw, 10 min) was performed, and ionization deplating was performed on the original AF anti-fingerprint oil on the surface of the finished composite cover plate so that a water contact angle of the surface of the finished composite cover plate was less than or equal to 30°.

In S03, a stock solution formed by the perfluoropolyether mixture and the silane coupling agent was uniformly coated on the surface of one side of the substrate body CGS using a high-pressure nozzle, baked at a low temperature of 65° C. for 2 hours, and it was confirmed that a water contact angle of the surface of the composite cover plate CG was greater than or equal to 110°.

In S04, the copper rod rub test was performed. The amount of static electricity on the surface of the product was recorded before the rubbing, whether there were abnormal displays such as local green luminescence, blurred screen and splash screen was checked under W3 (White 3 grayscale) at the brightness of 500 nits and W32 (White 32 grayscale) at the brightness of 2 nits after the rubbing was performed for 8 hours and 24 hours, respectively, the Level was measured according to the limit samples specified by the factory according to the specifications issued by the customer, and the difference between the initial static electricity amount on the surface of the product and the static electricity amount after 8 hours was read.

TABLE 4

Comparison of static electricity on the surface of the composite cover plate in Example 4

| Group | Comparative group | | Example 4 | |
|---|---|---|---|---|
| Judgement picture | 500 nits W3 | 2 nits W32 | 500 nits W3 | 2 nits W32 |
| Rub for 8 hours | Level Level 1 | Level 0 | Level 1 | Level 1 |
| Rub for 24 hours | Level Level 2 | Level 2 | Level 1 | Level 1 |
| Δ Static electricity amount (8 hours) | −302 mv | | −272 mv | |

As can be seen from Example 4, the composite cover plate was improved to some extent in the low grayscale brightness in the copper rod rub test but the improvement did not reach the ideal standard, and the amount of accumulated static electricity after the copper rod rub was slightly reduced. The above is related to the low film-forming efficiency of organic monosiloxane and perfluorocetane and butyl ether in the AF solution, and the prepared product can meet the product specifications of mildly defective products.

Figure 9:
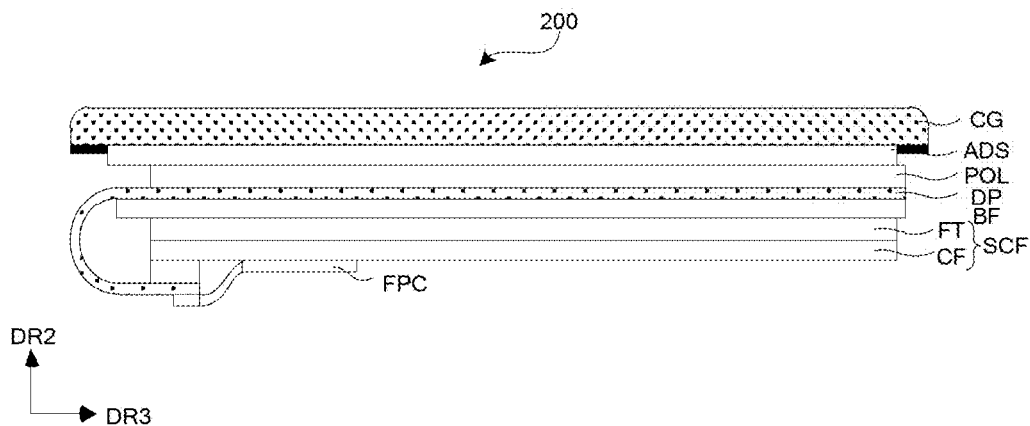
FIG. 9 is a structural diagram of a display device according to the present application.

Based on the same concept, the present application further provides a display device, as shown in FIG. 9. The display device includes a display module and a composite cover plate covering the surface of the display module. The composite cover plate is any composite cover plate CG described above, and an antistatic film layer ASAF is arranged on a side of the composite cover plate CG facing away from the display module. The display module 200 includes a display panel DP and a bottom protective film BF. In order to enhance heat dissipation, a metal heat dissipation layer SCF (for example, foam tape FT, copper foil CF) may also be arranged (for example, in a manner of sticking or bonding) on the back side of the display panel DP. The display panel DP includes a substrate, a driving functional layer and a display functional layer (not shown) which are stacked sequentially and also includes a polarizing layer POL, an adhesive layer ADS and a composite cover plate CG which are sequentially stacked on the display functional layer. The substrate body is surrounded by conductive copper foil, and the resistance is extremely low. Static electricity migrates to the low resistance direction through the conductive film layer in the antistatic film layer ASAF, and then the charge generated on the composite cover plate CG is conducted to the conductive blocking layer CBL through the conductive thin film, so as to achieve the release of static electricity.

In some embodiments, the display panel DP may be a flexible display panel. The flexible display panel includes a bending area and a binding area, and the binding area is bent to a side away from the light emission surface through the bending area to bind with the FPC, so as to achieve signal control.

Figure 10:
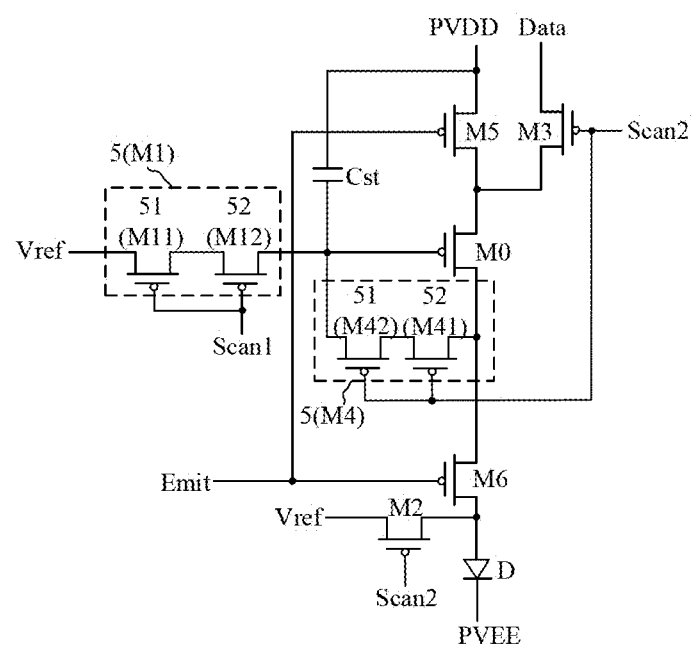
FIG. 10 is a schematic diagram of an equivalent pixel circuit according to the present application.

Specifically, the present application also illustrates a pixel circuit in the driving function layer. As shown in FIG. 10, FIG. 10 is a schematic diagram of an equivalent pixel circuit according to the present application. The pixel circuit includes a driving transistor M0, a gate reset transistor M1, an anode reset transistor M2, a data writing transistor M3, a threshold compensation transistor M4, a first light-emitting control transistor M5, a second light-emitting control transistor M6, and a storage capacitor Cst.

A gate of the gate reset transistor M1 is electrically connected to the first scan signal line Scan1, the first pole of the gate reset transistor M1 is electrically connected to the reset signal line Vref, and the second pole of the first gate reset transistor M1 is electrically connected to the gate of the driving transistor M0.

A gate of the anode reset transistor M2 is electrically connected to the second scan signal line Scan2, the first pole of the anode reset transistor M2 is electrically connected to the reset signal line Vref, and the second pole of the anode reset transistor M2 is electrically connected to the anode of the light-emitting element D.

A gate of the data writing transistor M3 is electrically connected to the second scan signal line Scan2, the first pole of the data writing transistor M3 is electrically connected to the data line Data, and the second pole of the data writing transistor M3 is electrically connected to the first pole of the driving transistor M0.

A gate of the threshold compensation transistor M4 is electrically connected to the second scan signal line Scan2, the first pole of the threshold compensation transistor M4 is electrically connected to the second pole of the driving transistor M0, and the second pole of the threshold compensation transistor M4 is electrically connected to the gate of the driving transistor M0.

A gate of the first light-emitting control transistor M5 is electrically connected to the light emission control signal line Emit, the first pole of the first light-emitting control transistor M5 is electrically connected to the fixed potential signal line PVDD, and the second pole of the first light-emitting control transistor M5 is electrically connected to the first pole of the driving transistor M0.

A gate of the second light-emitting control transistor M6 is electrically connected to the light emission control signal line Emit, the first pole of the second light-emitting control transistor M6 is electrically connected to the second pole of the driving transistor M0, and the second pole of the second light-emitting control transistor M6 is electrically connected to the anode of the light-emitting element D.

The first plate of the storage capacitor Cst is electrically connected to the fixed potential signal line PVDD, and the second plate of the storage capacitor Cst is a gate of the driving transistor M0.

In addition, it is to be emphasized that the types of transistors included in the pixel circuit shown in FIG. 10 are only illustrative, and in other optional examples of the present application, the transistors in the pixel circuit may all be N-type transistors, or the pixel circuit may include both N-type transistors and P-type transistors. For example, in the pixel circuit, the gate reset transistor M1 and the threshold compensation transistor M4 may be an N-type indium gallium zinc oxide (IGZO) transistor, the other transistors may be a P-type low temperature poly-silicon (LTPS) transistor, and at this point, the threshold compensation transistor M4 and the data writing transistor M3 are electrically connected to different scan signal lines. When the pixel circuit includes other types of transistors, the operation principle of the pixel circuit remains the same as that of the pixel circuit corresponding to FIG. 10, except that the on-level of the transistors changes.

Based on the same concept, the embodiments of the present application provide a display device. In the specific implementation, the display device may be any product or component with a display function such as a mobile phone, a tablet computer, a television, a monitor, a laptop, a digital photo frame, a navigator, etc. For embodiments of the display device, reference may be made to the preceding examples of the composite cover plate and display module, and the details will not be repeated.

The technical features of the preceding embodiments may be combined in any manner. For brevity of description, all possible combinations of the technical features in the preceding embodiments are not described. However, as long as the combinations of these technical features do not conflict, such combinations are to be construed as being within the scope of the specification.

It is apparent to those skilled in the art that various modifications and variations can be made to the present application without departing from the spirit and scope of the present application. In this case, if such modifications and variations of the present application are within the scope of the claims of the present application and equivalent technologies thereof, the present application is intended to include such modifications and variations.

What is claimed is:

1. A composite cover plate, comprising:
   a substrate body;
   wherein the substrate body comprises two surfaces that are arranged opposite, and at least one surface is provided with an antistatic film layer;
   the antistatic film layer comprises a perfluoropolyether mixture and a silane coupling agent;
   wherein the silane coupling agent comprises a sulfur-containing silane coupling agent, an amino silane coupling agent and an epoxy silane coupling agent.

2. The composite cover plate according to claim 1, wherein the silane coupling agent comprises one or more of polyether monosiloxane, polyether trisiloxane, hydroxyl polyether modified polyorganosiloxane, carboxyl polyethylene glycol silane, polyether modified polydimethylsiloxane, polyether modified polysiloxane, tetramethyldisiloxane, dodecylsiloxane, dimethyldichlorosilane and organic monosiloxane.

3. The composite cover plate according to claim 1, wherein the molecular structural formula of the silane coupling agent is Y—R—Si(OR)$_3$, wherein Y refers to an organic functional group, R refers to a sulfur-containing carboxyl group, a sulfur-containing hydroxyl group, an amino-containing carboxyl group, an amino-containing hydroxyl group, an epoxy carboxyl group and an epoxy hydroxyl group, and SiOR refers to a siloxy group.

4. The composite cover plate according to claim 1, wherein a mass ratio of the perfluoropolyether mixture to the silane coupling agent ranges from 100:1 to 90:1.

5. The composite cover plate according to claim 1, wherein the perfluoropolyether mixture and the silane coupling agent are uniformly distributed in the antistatic film layer.

6. The composite cover plate according to claim 1, wherein a surface resistivity of the antistatic film layer is between $10^{13}$ Ω·cm and $10^{16}$ Ω·cm.

7. The composite cover plate according to claim 1, wherein the composite cover plate further comprises a conductive blocking layer, the conductive blocking layer is disposed around edges of the composite cover plate, and the antistatic film layer is in contact with the conductive blocking layer.

8. The composite cover plate according to claim 1, wherein a thickness of the antistatic film layer is between 5 nm and 10 nm.

9. The composite cover plate according to claim 1, wherein a water contact angle of the antistatic film layer is between 100° and 115°.

10. The composite cover plate according to claim 1, wherein the water contact angle of the antistatic film layer is between 80° and 110°.

* * * * *